US012178135B2

(12) United States Patent  
Yoshida et al.

(10) Patent No.: US 12,178,135 B2  
(45) Date of Patent: Dec. 24, 2024

(54) SEMICONDUCTOR DEVICE WITH DEPRESSION IN PACKAGE AND METHOD FOR MANUFACTURING SAME

(71) Applicant: Murata Manufacturing Co., Ltd., Nagaokakyo (JP)

(72) Inventors: Yoshihiro Yoshida, Nagaokakyo (JP); Koichi Yoshida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 415 days.

(21) Appl. No.: 17/685,436

(22) Filed: Mar. 3, 2022

(65) Prior Publication Data

US 2022/0190230 A1 Jun. 16, 2022

Related U.S. Application Data

(63) Continuation of application No. PCT/JP2020/026094, filed on Jul. 2, 2020.

(30) Foreign Application Priority Data

Sep. 12, 2019 (JP) .................................. 2019-166462  
Mar. 27, 2020 (JP) .................................. 2020-057336

(51) Int. Cl.
| | | |
|---|---|---|
| *H01L 41/053* | (2006.01) | |
| *H01L 41/113* | (2006.01) | |
| *H01L 41/23* | (2013.01) | |
| *H10N 30/02* | (2023.01) | |
| *H10N 30/30* | (2023.01) | |
| *H10N 30/88* | (2023.01) | |

(52) U.S. Cl.  
CPC ............. *H10N 30/88* (2023.02); *H10N 30/02* (2023.02); *H10N 30/302* (2023.02)

(58) Field of Classification Search  
CPC ...................................................... H10N 30/88  
See application file for complete search history.

(56) References Cited

U.S. PATENT DOCUMENTS 9,448,130 B2 9/2016 Vaupel et al.  
2002/0006687 A1* 1/2002 Lam .................. H01L 27/14625  
257/E31.118

(Continued)

FOREIGN PATENT DOCUMENTS

| JP | 2006303413 A | * 11/2006 |
|---|---|---|
| JP | 2008-211124 A | 9/2008 |

(Continued)

OTHER PUBLICATIONS

Official Communication issued in International Patent Application No. PCT/JP2020/026094, mailed on Sep. 8, 2020.

*Primary Examiner* — Peter Bradford  
(74) *Attorney, Agent, or Firm* — Keating & Bennett, LLP

(57) ABSTRACT

A semiconductor device includes a base, a detector on the base and including a first surface on which a detection portion is provided, and a resin package on the base and including an exposure hole to externally expose the detection portion of the detector. At least a portion of an outer peripheral edge of the first surface of the detector is exposed in the exposure hole. The resin package includes a depressed portion along the portion of the outer peripheral edge that is exposed in the exposure hole.

18 Claims, 8 Drawing Sheets

SECTION A-A

(56) References Cited

U.S. PATENT DOCUMENTS

| | | | |
|---|---|---|---|
| 2009/0291532 A1* | 11/2009 | Takase | H01L 21/566 257/E21.504 |
| 2010/0224945 A1 | 9/2010 | Takahata et al. | |
| 2011/0016981 A1* | 1/2011 | Gebauer | G01L 19/143 29/829 |
| 2015/0059454 A1* | 3/2015 | Vaupel | H01L 23/00 73/65.09 |
| 2015/0270206 A1* | 9/2015 | Lo | G01L 19/147 438/51 |
| 2020/0381371 A1* | 12/2020 | Yoshida | G01L 19/141 |

FOREIGN PATENT DOCUMENTS

| | | | | |
|---|---|---|---|---|
| JP | 2010-230655 A | 10/2010 | | |
| JP | 2012-083124 A | 4/2012 | | |
| WO | WO-2012133065 A1 * | 10/2012 | | G01L 19/0084 |
| WO | WO-2013129186 A1 * | 9/2013 | | G01L 19/069 |

* cited by examiner

SECTION A-A

SECTION B-B

SECTION C-C

SECTION D-D

SEMICONDUCTOR DEVICE WITH DEPRESSION IN PACKAGE AND METHOD FOR MANUFACTURING SAME

CROSS REFERENCE TO RELATED APPLICATIONS

This application claims the benefit of priority to Japanese Patent Application No. 2019-166462 filed on Sep. 12, 2019 and Japanese Patent Application No. 2020-057336 filed on Mar. 27, 2020, and is a Continuation Application of PCT Application No. PCT/JP2020/026094 filed on Jul. 2, 2020. The entire contents of each application are hereby incorporated herein by reference.

BACKGROUND OF THE INVENTION

1. Field of the Invention

The present invention relates to a semiconductor device including a resin package and a method for manufacturing the same.

2. Description of the Related Art

For example, U.S. Pat. No. 9,448,130 discloses a semiconductor device (sensor structure) in which a detection element (sensor component) is installed on a substrate (carrier) and a resin package (mold structure) having an exposure hole to externally expose the detection element covers the substrate.

In the case where a resin package is provided as in the semiconductor device described in U.S. Pat. No. 9,448,130, the resin package needs to be made without a drop in detection performance of a detection element. For example, it is necessary to prevent, in making the resin package, a drop in detection performance of the detection element due to the detection portion of the detection element being covered by the resin material.

SUMMARY OF THE INVENTION

Preferred embodiments of the present invention provide semiconductor devices each including a detector including a detection portion and a resin package including an exposure hole to externally expose the detection portion, and in each of which a reduction in detection performance of the detector due to the resin package is reduced or prevented.

A semiconductor device according to a preferred embodiment of the present invention includes a base, a detector on the base and including a first surface on which a detection portion is provided, and a resin package on the base and including an exposure hole to externally expose the detection portion of the detector, wherein at least a portion of an outer peripheral edge of the first surface of the detector is exposed in the exposure hole, and the resin package includes a depressed portion along the portion of the outer peripheral edge that is exposed in the exposure hole.

A method of manufacturing a semiconductor device according to a preferred embodiment of the present invention in which, on a base on which a detector including a first surface on which a detection portion is located is provided, a resin package including an exposure hole to externally expose the detection portion of the detector is provided, the method includes bringing a mold release film into close contact with a mold that includes a cavity with a projection, placing the mold with respect to the base such that the first surface of the detector sinks into a portion of the mold release film that is positioned on a top surface of the projection, filling the cavity of the mold with a melted resin material, separating the mold and the mold release film from the resin package that includes a solidified resin material, and positioning an outer peripheral edge of the top surface of the projection so that, in a view from a direction in which the projection of the mold and the first surface of the detector face each other, the outer peripheral edge is at least partially positioned in an outer side portion of an outer peripheral edge of the first surface.

According to preferred embodiments of the present invention, it is possible to reduce or prevent, in semiconductor devices each including a detector including a detection portion and a resin package including an exposure hole to externally expose the detection portion, a reduction in detection performance of the detector due to the resin package.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
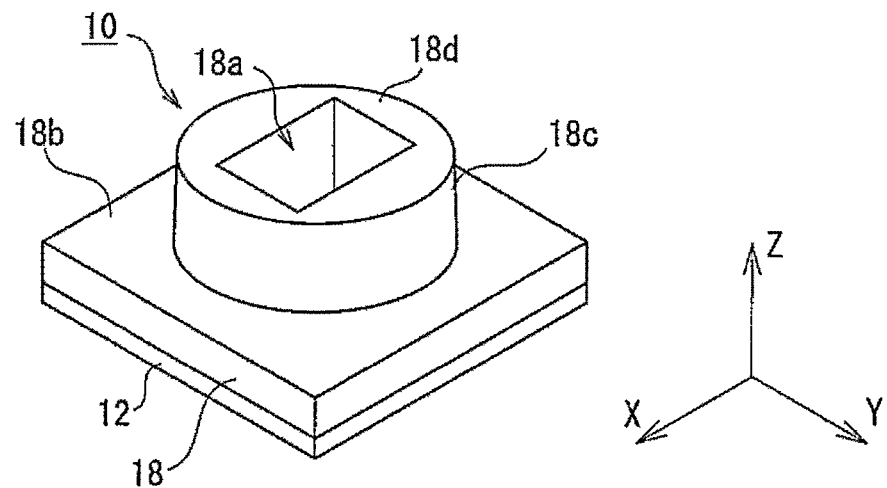
FIG. 1 is a perspective view of a semiconductor device according to Preferred Embodiment 1 of the present invention.

Preferred embodiments of the present invention will be described below with reference to the drawings.

A semiconductor device according to a preferred embodiment of the present invention includes a base, a detector that is provided on the base and include a first surface on which a detection portion is provided, and a resin package that is provided on the base and includes an exposure hole to externally expose the detection portion of the detector. At least a portion of an outer peripheral edge of the first surface of the detector is exposed in the exposure hole. The resin package includes a depressed portion along the portion of the outer peripheral edge that is exposed in the exposure hole.

According to the preferred embodiment described above, a reduction in detection performance of the detector due to the resin package can be reduced or prevented.

For example, when the detector includes a connection terminal provided on the first surface so as to be adjacent to a portion of the outer peripheral edge, a portion of the outer peripheral edge other than the portion adjacent to the connection terminal may be exposed in the exposure hole, the connection terminal may be covered by the resin package, and the resin package may include a depressed portion along the portion of the outer peripheral edge that is exposed in the exposure hole.

For example, when the detector includes a connection terminal provided on the first surface so as to be adjacent to a portion of the outer peripheral edge, the detector may include a groove provided in a portion between the detection portion and the connection terminal on the first surface.

For example, when the detector includes a connection terminal provided on a second surface on a side opposite to the first surface, the outer peripheral edge of the first surface of the detector may be exposed in the exposure hole, and the resin package may include an annular depressed portion along the outer peripheral edge exposed in the exposure hole.

For example, the semiconductor device may further include a circuit provided on the base, and in this case, the circuit may be buried in the resin package.

For example, when the resin package includes a main body portion provided on the base and a cylindrical ring holding portion provided in a central portion of a surface of the main body portion on a side opposite to the base and that includes, at a top surface thereof, an opening of the exposure hole and the base further includes, on a surface of the base on a side opposite to the resin package, a plurality of external connection terminals located around a center line of the ring holding portion, in a top view of the base, each of the external connection terminals may be at least partially positioned in an outer side portion of a periphery of the ring holding portion.

A non-limiting example of a method of manufacturing a semiconductor device according to a preferred embodiment of the present invention is a method of manufacturing a semiconductor device in which, on a base on which a detector including a first surface on which a detection portion is located is provided, a resin package that includes an exposure hole to externally expose the detection portion of the detector is provided. The method includes bringing a mold release film into close contact with a mold that includes a cavity with a projection, placing the mold with respect to the base such that the first surface of the detector sinks into a portion of the mold release film that is positioned on a top surface of the projection, filling the cavity of the mold with a melted resin material, separating the mold and the mold release film from the resin package that includes a solidified resin material, and positioning an outer peripheral edge of the top surface of the projection so that, in a view from a direction in which the projection of the mold and the first surface of the detector face each other, the outer peripheral edge is at least partially positioned in an outer side portion of an outer peripheral edge of the first surface.

According to such a method, a reduction in detection performance of the detector due to the resin package can be reduced or prevented.

For example, when the detector includes a connection terminal provided on the first surface so as to be adjacent to a portion of the outer peripheral edge, in the view from the direction in which the projection of the mold and the first surface of the detector face each other, the outer peripheral edge of the top surface of the projection may be partially positioned in an outer side portion of a portion of the outer peripheral edge of the first surface other than the portion adjacent to the connection terminal.

For example, when the detector includes a connection terminal provided on the first surface so as to be adjacent to a portion of the outer peripheral edge, the detector may include a groove provided in a portion between the detection portion and the connection terminal on the first surface.

For example, when the detector includes a connection terminal provided on a second surface on a side opposite to the first surface, in the view from the direction in which the projection of the mold and the first surface of the detector face each other, the outer peripheral edge of the top surface of the projection may be entirely positioned in the outer side portion of the outer peripheral edge of the first surface.

Preferred Embodiment 1

Figure 2:
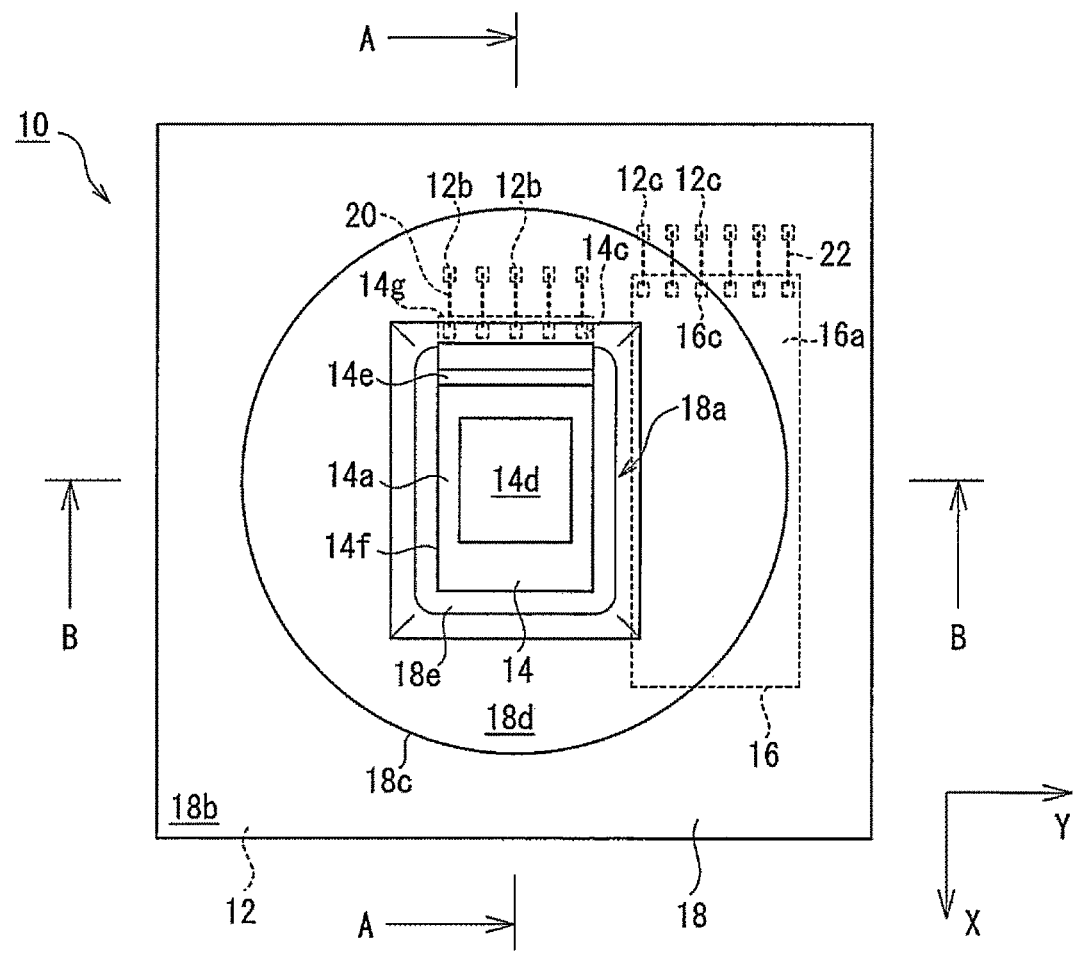
FIG. 2 is a top view of the semiconductor device according to Preferred Embodiment 1 of the present invention.
Figure 3A:
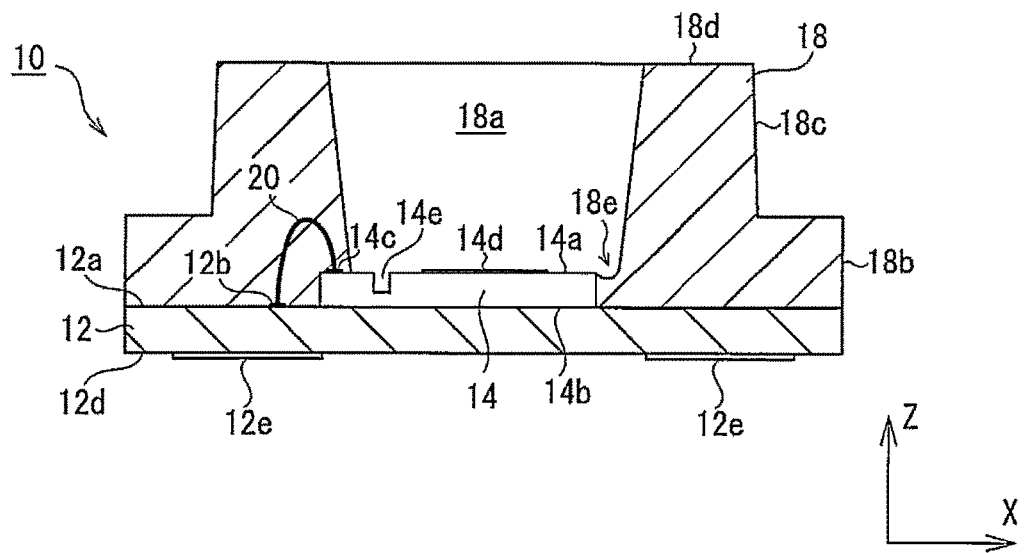
FIG. 3A is a sectional view of the semiconductor device taken along the line A-A of FIG. 2.
Figure 3B:
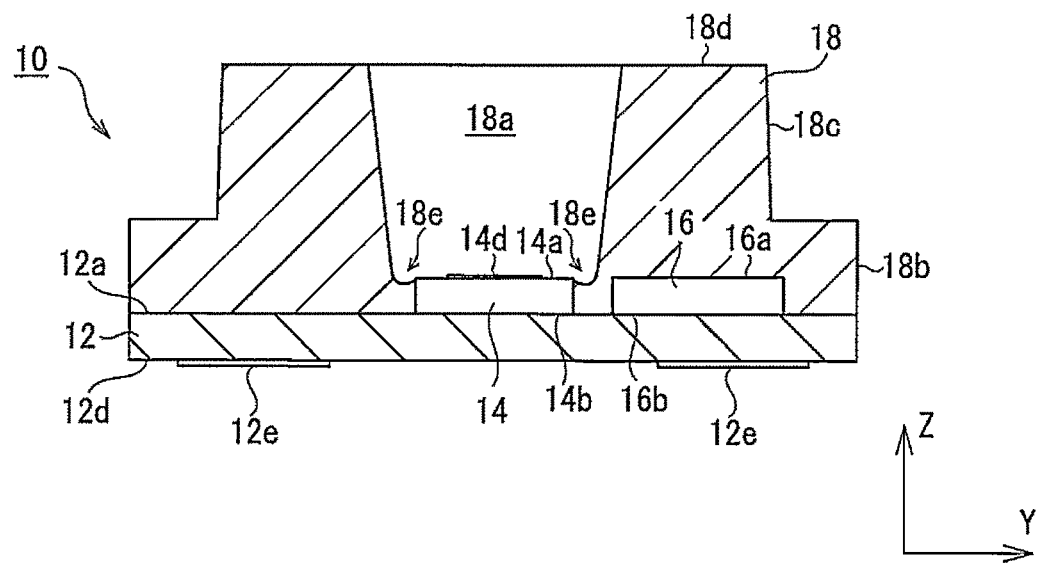
FIG. 3B is a sectional view of the semiconductor device taken along the line B-B of FIG. 2.

FIG. 1 is a perspective view of a semiconductor device according to Preferred Embodiment 1 of the present invention. Further, FIG. 2 is a top view of the semiconductor device according to Preferred Embodiment 1. Further, FIGS. 3A and 3B are sectional views of the semiconductor device according to Preferred Embodiment 1 taken along the lines A-A and B-B of FIG. 2. The X-Y-Z orthogonal coordinate systems illustrated in FIGS. 1 to 3B are to facilitate the understanding preferred embodiments of the present invention and does not limit the present invention.

As illustrated in FIGS. 1 to 3B, a semiconductor device 10 according to Preferred Embodiment 1 is, for example, a pressure sensor configured to measure pressure and includes a base 12 and a detector 14 provided on the base 12. Further, in the case of Preferred Embodiment 1, a circuit 16 is provided on the base 12. In addition, in the case of Preferred Embodiment 1, the semiconductor device 10 includes a resin package 18 provided on the base 12. As the pressure that is measured by the semiconductor device 10, for example, absolute pressure, gauge pressure, differential pressure, air flow pressure, and the like are provided.

As illustrated in FIG. 2 and FIGS. 3A and 3B, the base 12 is a substrate including a first surface 12a and is a wiring substrate such as, for example, a ceramic substrate or a resin substrate. The base 12 may be, for example, a lead frame. On the first surface 12a of the base 12, the detector 14 and the circuit are located side by side. In Preferred Embodiment 1, the detector 14 and the circuit 16 are fixed on the first surface 12a of the base 12 with an adhesive member, which is not illustrated. For example, a die attach film, a die bond material, or the like may be used as the adhesive member. Further, as illustrated in FIG. 2 and FIG. 3A, on the first surface 12a of the base 12, connection terminals 12b that are electrically connected to the detector 14 with a bonding wire 20 interposed therebetween and connection terminals 12c that are electrically connected to the circuit 16 with a bonding wire 22 interposed therebetween are provided. In addition, as illustrated in FIGS. 3A and 3B, the base 12 includes a second surface 12d on the side opposite to the first surface 12a. On the second surface 12d, external connection terminals 12e that are electrically connected to the substrate of another external electronic device (not illustrated) are provided.

In the case of Preferred Embodiment 1, the detector 14 is, for example, a pressure sensor to measure pressure and includes, as illustrated in FIG. 3A, a first surface 14a and a second surface 14b on the side opposite to the first surface 14a. The detector is, for example, a piezoresistive pressure sensor or an electrostatic capacitive pressure sensor and is a micro electro mechanical system (MEMS) element.

Further, the detector 14 includes, as illustrated in FIG. 2, a plurality of connection terminals 14c provided on the first surface 14a to be electrically connected to the connection terminals 12b of the base 12 with the bonding wire 20 interposed therebetween. With this, the detector 14 is electrically connected to the circuit 16 with the base 12 (the conductor pattern provided on the substrate (not illustrated)) interposed therebetween.

In addition, the detector 14 includes, on the first surface 14a, a detection portion 14d on which pressure acts. In the case of Preferred Embodiment 1, the detection portion 14d of the detector 14, which is the pressure sensor, for example, is a membrane or a diaphragm for receiving pressure. The detection portion 14d includes, for example, a passivation film and is thus resistant to water.

Moreover, the detector 14 includes a groove 14e provided in a portion between the plurality of connection terminals 14c and the detection portion 14d on the first surface 14a. The reason for this is described later.

In the case of Preferred Embodiment 1, the circuit 16 includes, as illustrated in FIG. 3B, a first surface 16a and a second surface 16b on the side opposite to the first surface 16a. The circuit 16 is, for example, an element including an application specific integrated circuit (ASIC). In the case of Preferred Embodiment 1, the circuit 16 is provided on the first surface 12a of the base 12 with the second surface 16b adjacent thereto. Further, the circuit 16 includes, as illustrated in FIG. 2, a plurality of connection terminals 16c provided on the first surface 16a to be electrically connected to the connection terminals 12c of the base 12 with the bonding wire 22 interposed therebetween. With this, the circuit 16 is electrically connected to the detector with the base 12 (the conductor pattern provided on the substrate (not illustrated)) interposed therebetween.

The circuit 16 also includes a signal processing circuit configured or programmed to process a signal output from the detector 14 and output the processed signal to the base 12. For example, in the case of Preferred Embodiment 1, the circuit 16 includes a converter to convert a voltage signal output from the detector 14 to a digital signal, a filter to filter a digital signal from the converter, a temperature sensor to detect a temperature, a processor configured or programmed to correct a filtered digital signal based on a temperature detected by the temperature sensor, a memory to store correction factors and the like that are used to correct a digital signal using a detected temperature, and the like.

In the case of Preferred Embodiment 1, the resin package 18 is made by molding a hard resin, for example, a thermosetting resin, on the first surface 12a of the base 12. The details of a non-limiting example of a method of making the resin package 18 are described later.

The portion of the first surface 12a of the base 12 that includes the plurality of connection terminals 12b and 12c is covered by the resin package 18 to be protected and made resistant to water. Further, the detector 14 (in particular, connection terminals 14c), the circuit 16 (in particular, connection terminals 16c), and the bonding wires 20 and 22 to electrically connect the detector and the circuit are buried in the resin package 18 to be protected and made resistant to water. That is, with the resin package 18, the electrical connection between the base 12 and the detector 14 and the electrical connection between the base 12 and the circuit 16 are protected.

To enable pressure to act on the detection portion 14d of the detector 14, as illustrated in FIG. 1 and FIGS. 3A and 3B, the resin package 18 includes an exposure hole 18a to expose the detection portion 14d of the detector 14 to the outside of the resin package 18.

Specifically, in the case of Preferred Embodiment 1, as illustrated in FIG. 1, the resin package 18 has a rectangular or substantially rectangular parallelepiped main body portion 18b provided on the base 12 and a cylindrical ring holding portion 18c provided on the main body portion 18b. The ring holding portion 18c is provided in the central portion of the surface of the main body portion 18b on the side opposite to the base 12. The exposure hole 18a opens in a top surface 18d of the ring holding portion 18c and extends toward the first surface 12a of the base 12. With the exposure hole 18a, pressure acts on the detection portion 14d of the detector 14 exposed to the outside of the resin package 18 so that the semiconductor device 10 can measure the pressure.

The ring holding portion 18c of the resin package 18 is to hold an O-ring (not illustrated) on its outer peripheral surface. For example, the ring holding portion 18c of the resin package 18 of the semiconductor device 10 is inserted, with the intermediation of the O-ring, into a through hole to communicate the interior space of the casing of an electronic device on which the semiconductor device 10 is mounted with the outside. That is, in the case of Preferred Embodiment 1, the resin package 18 also defines and functions as a member to mount the semiconductor device 10 on the electronic device.

In addition, the resin package 18 includes a depressed portion 18e. As illustrated in FIG. 2, in the exposure hole 18a, at least a portion of an outer peripheral edge 14f of the first surface 14a of the detector 14 is exposed. The depressed portion 18e is provided along the outer peripheral edge 14f exposed in the exposure hole 18a. That is, the portion of the resin package 18 that is positioned on the first surface 14a of the detector 14 is reduced as much as possible. The reason why the resin package 18 is provided in this way is described later.

Specifically, in the case of Preferred Embodiment 1, the outer peripheral edge 14f of the first surface 14a of the detector 14 has a rectangular or substantially rectangular shape with the four sides in the top view (Z-axis direction view). A side 14g of the outer peripheral edge 14f along which the plurality of connection terminals 14c connected to the bonding wire 20 are provided adjacent to each other is buried in the resin package 18 together with the connection terminals 14c and the bonding wire 20. Meanwhile, the sides of the outer peripheral edge 14f other than the side 14g are exposed to the outside of the resin package 18. Further, the resin package 18 includes the depressed portion 18e along the sides of the outer peripheral edge 14f other than the side 14g. The "depressed portion" herein has a shape with a depth of, for example, approximately 10 μm and a base portion positioned on the base 12 side with respect to the first surface 14a of the detector 14.

With the resin package 18, on the first surface 14a of the detector 14, the plurality of connection terminals 14c and the peripheral portions are buried in the resin package 18.

Next, a non-limiting example of a method of manufacturing the semiconductor device 10, in particular, a method of making the resin package 18 is described.

FIGS. 4A to 4D are each a diagram illustrating a process of making a resin package in the method of manufacturing the semiconductor device 10.

Figure 4A:
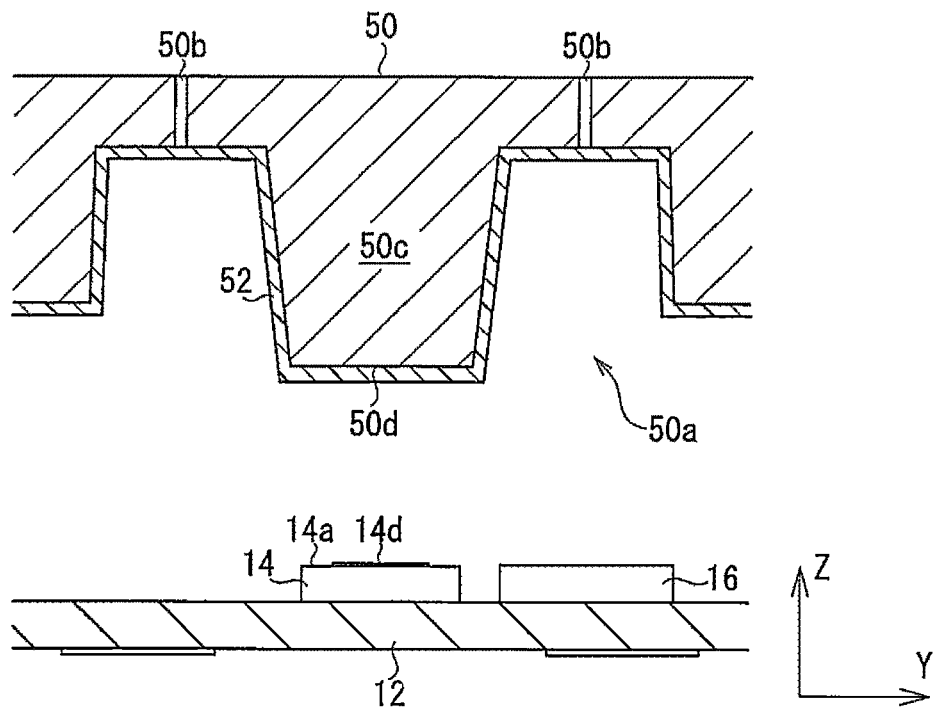
FIG. 4A is a diagram illustrating a process of making a resin package.

First, as illustrated in FIG. 4A, the detector 14 and the circuit 16 are mounted, and the base 12 including the bonding wires 20 and 22 is placed in a predetermined position of a mold 50. The mold 50 includes a cavity 50a for forming the resin package 18 and a suction hole 50b for sucking air inside the cavity 50a. Further, in the cavity 50a, a projection 50c for forming the exposure hole 18a of the resin package 18 is provided. The projection 50c includes a planar top surface 50d.

As illustrated in FIG. 4A, before the mold 50 is filled with the resin material of the resin package 18, a mold release film 52 is sucked through the suction hole 50b to be brought into close contact with the surface of the cavity 50a. The mold release film 52 is a heat-resistant resin film including a surface coated with release agent, for example.

Figure 4B:
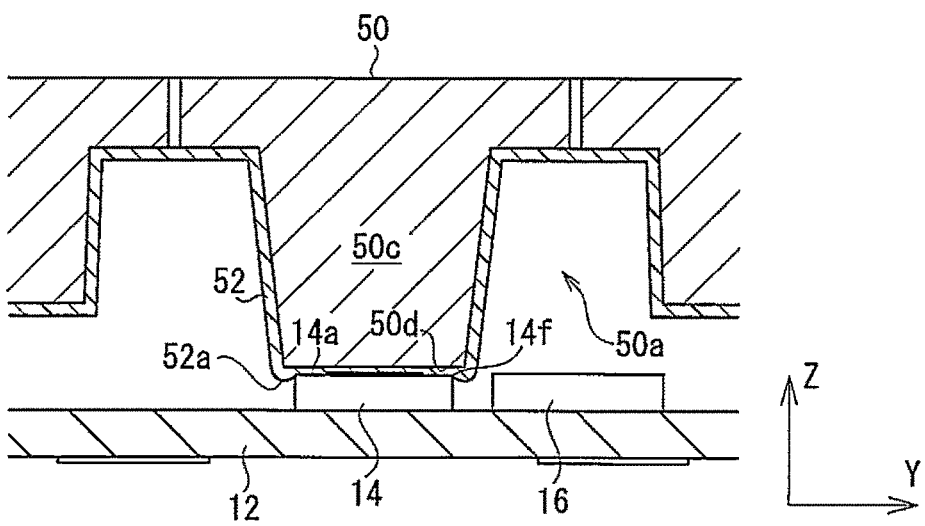
FIG. 4B is a diagram illustrating a process of making a resin package following the process of FIG. 4A.

As illustrated in FIG. 4B, the mold 50 with the mold release film 52 in close contact with the surface of the cavity 50a is brought closer to the base 12 so that the top surface 50d of the projection 50c of the mold 50 is brought into contact with the detector 14 on the base 12 with the mold release film 52 interposed therebetween. With this, the mold 50 is located with respect to the base 12 in a manner in which the first surface 14a of the detector 14 sinks into the portion of the mold release film 52 that is positioned on the top surface 50d of the projection 50c.

Figure 5:
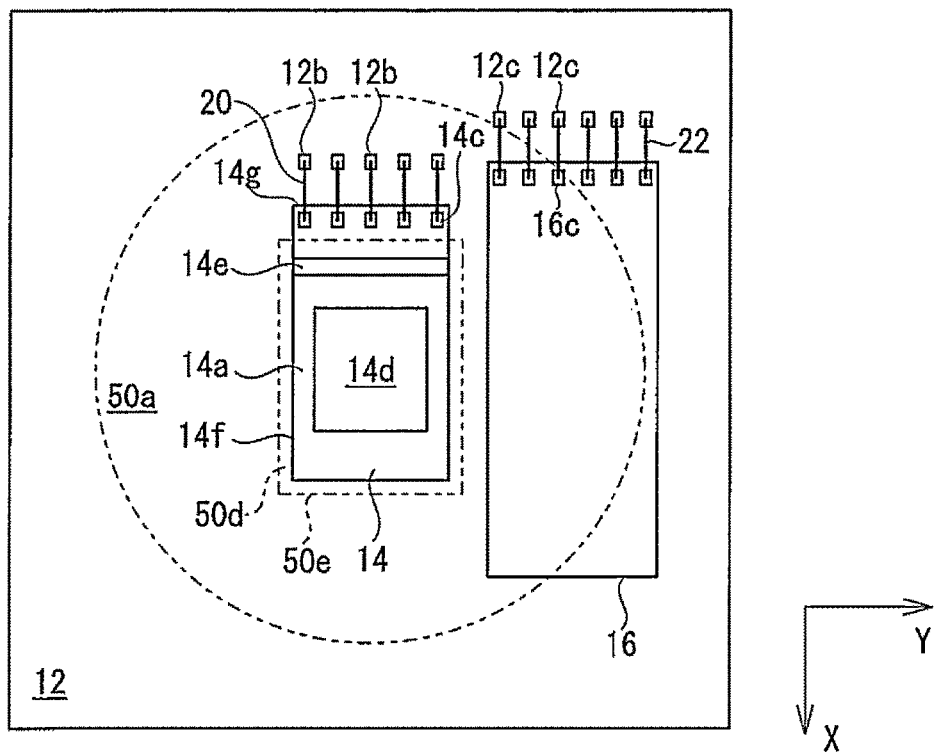
FIG. 5 is a top view of the semiconductor device, illustrating the positional relationship and size relationship between a mold and a detector.

FIG. 5 is a top view of the semiconductor device, illustrating the positional relationship between the mold and the detector.

As illustrated in FIG. 5, in the case of Preferred Embodiment 1, the top surface 50d of the projection 50c of the mold 50 has a rectangular or substantially rectangular shape and includes an outer peripheral edge 50e. Further, as illustrated in FIG. 4B, when the top surface 50d of the projection 50c of the mold 50 is in contact with the detector 14 with the mold release film 52 interposed therebetween, in the view from the direction in which the projection 50c and the first surface 14a of the detector 14 face each other (Z-axis direction view), the outer peripheral edge 50e of the top surface 50d is at least partially positioned in the outer side portion of the outer peripheral edge 14f of the first surface 14a.

In the case of Preferred Embodiment 1, as illustrated in FIG. 5, the outer peripheral edge 50e of the top surface 50d of the projection 50c of the mold 50 is partially positioned in the outer side portion of the portion of the outer peripheral edge 14f of the first surface 14a of the detector 14 other than the side 14g along which the plurality of connection terminals 14c are formed. That is, the portion near the side 14g and the connection terminals 14c does not face the top surface 50d of the projection 50c of the mold 50.

With such a positional and size relationship between the top surface 50d of the projection 50c of the mold 50 and the first surface 14a of the detector 14, as illustrated in FIG. 4B, a wall portion 52a of the mold release film 52 is formed to protrude toward the base 12 over the first surface 14a and partially surround the outer peripheral edge 14f of the first surface 14a.

Figure 4C:
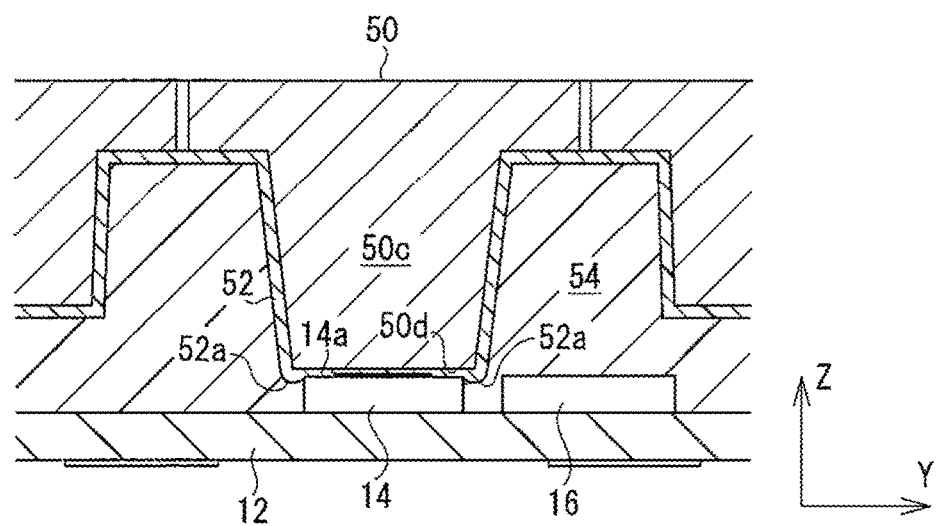
FIG. 4C is a diagram illustrating a process of making a resin package following the process of FIG. 4B.

Next, as illustrated in FIG. 4C, the cavity 50a of the mold 50 is filled with a melted resin material 54. At this time, with the wall portion 52a of the mold release film 52, the resin material 54 is prevented from entering the portion between the mold release film 52 and the first surface 14a of the detector 14. As a result, the resin material 54 is prevented from covering the detection portion 14d of the detector 14.

Figure 6:
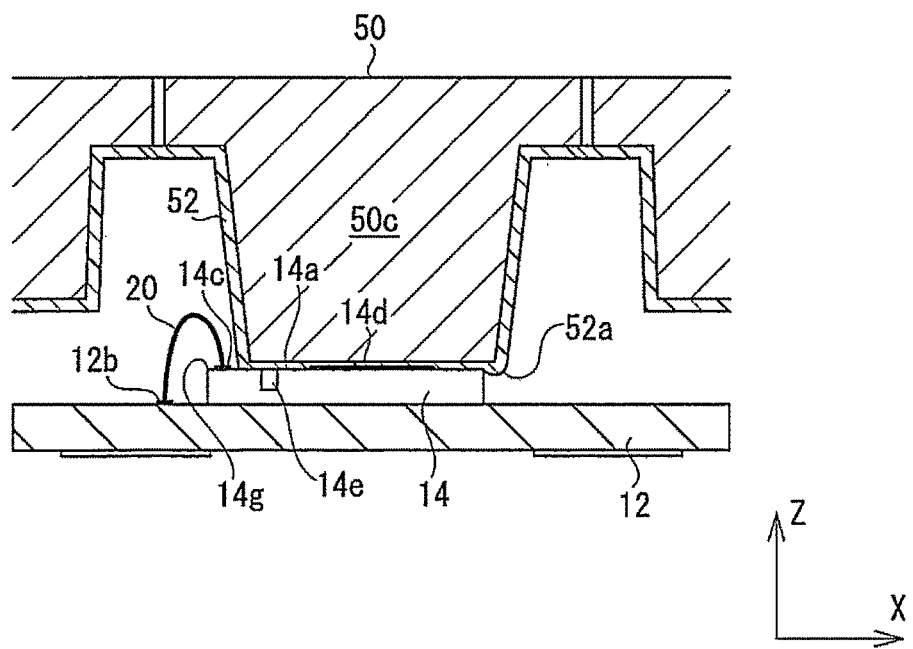
FIG. 6 is a diagram of the process illustrated in FIG. 4C, illustrating the semiconductor device in different cross section.

However, in the case of Preferred Embodiment 1, as illustrated in FIG. 6, the wall portion 52a of the mold release film 52 is not formed on the side 14g of the outer peripheral edge 14f of the first surface 14a of the detector 14. Thus, there is a risk that the resin material 54 enters the portion between the mold release film 52 and the first surface 14a of the detector 14 near the side 14g.

Accordingly, in the case of Preferred Embodiment 1, the groove 14e is provided in the portion between the plurality of connection terminals 14c and the detection portion 14d on the first surface 14a of the detector 14. When the resin material 54 enters the portion between the mold release film 52 and the first surface 14a of the detector 14 from the side 14g side, the entered resin material 54 flows in the groove 14e before reaching the detection portion 14d. As a result, the entered resin material 54 is prevented from reaching the detection portion 14d of the detector 14 and at least partially covering the detection portion 14d.

The groove 14e may be omitted when the distance between the plurality of connection terminals 14c and the detection portion 14d is sufficiently long, that is, when the distance is long enough to prevent the entered resin material 54 from reaching the detection portion 14d.

Figure 4D:
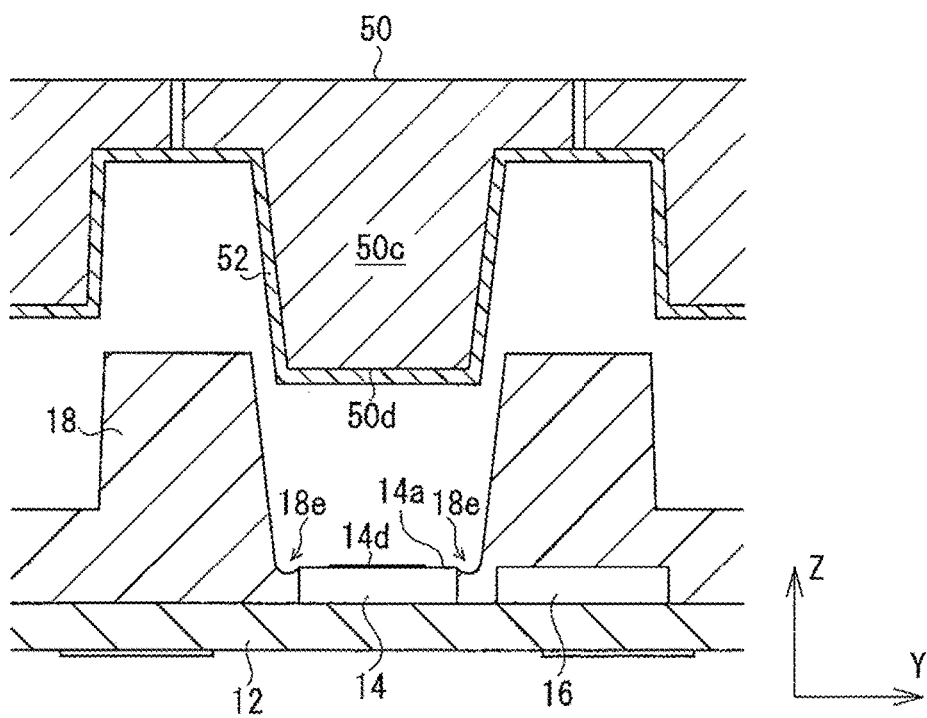
FIG. 4D is a diagram illustrating a process of making a resin package following the process of FIG. 4C.

As illustrated in FIG. 4C, when the cavity 50a of the mold 50 is filled with the resin material 54 and the resin material 54 is then solidified, as illustrated in FIG. 4D, the mold 50 and the mold release film 52 are separated from the solidified resin material 54. As a result, the resin package 18 including the depressed portion 18e, which has the shape corresponding to the wall portion 52a of the mold release film 52 illustrated in FIG. 4C and is formed partially along the outer peripheral edge 14f of the first surface 14a of the detector 14, is made on the base 12.

According to Preferred Embodiment 1 as described above, in the semiconductor device 10 including the detector 14 including the detection portion 14d and the resin package 18 including the exposure hole 18a to externally expose the detection portion 14d, a reduction in detection performance of the detector 14 due to the resin package 18 can be reduced or prevented.

Specifically, the resin package 18 includes the depressed portion 18e. As illustrated in FIG. 2, in the exposure hole 18a, at least a portion of the outer peripheral edge 14f of the first surface 14a of the detector 14 is exposed. The depressed portion 18e is provided along the outer peripheral edge 14f exposed in the exposure hole 18a. With this, the resin material 54 of the resin package 18 is prevented from covering the detection portion 14d of the detector 14 when making the semiconductor device 10. As a result, a reduction in detection performance of the detector 14 due to the resin package 18 is reduced or prevented.

Further, with this, the portion of the resin package 18 that is located on the first surface 14a of the detector 14 can be reduced as much as possible, with the result that a reduction in detection performance of the detector 14 is reduced or prevented.

A specific description is provided. When the semiconductor device 10 is being used, the resin package 18 receives an external force in some cases. For example, in the case of Preferred Embodiment 1, the resin package 18 receives a compression force from the O-ring held by the ring holding portion 18c. The external force acts on the detector 14 through the intermediation of the resin package 18. In particular, there is a risk that when the resin package 18 is partially located on the first surface 14a of the detector 14, the first surface 14a is warped through the intermediation of the resin package 18. As a result, the detection portion 14d provided on the first surface 14a is deformed and the detection performance of the detector 14 thus is reduced in some cases.

Accordingly, at least a portion of the outer peripheral edge 14f of the first surface 14a of the detector 14 is exposed in the exposure hole 18a and the depressed portion 18e is provided along the outer peripheral edge 14f exposed in the exposure hole 18a, to thus prevent the first surface 14a of the detector 14 from being warped (as compared to a case where the outer peripheral edge 14f is entirely buried in the resin package 18 and thus the resin package 18 does not include the depressed portion 18e). As a result, a reduction in detection performance of the detector 14 due to the resin package 18 is reduced or prevented.

Preferred Embodiment 2

In the case of Preferred Embodiment 1 described above, as illustrated in FIG. 2, the portion (side 14g) of the outer peripheral edge 14f of the first surface 14a of the detector 14 is buried in the resin package 18. Thus, the depressed portion 18e of the resin package 18 is not provided along the entire or substantially the entire outer peripheral edge 14f of the first surface 14a of the detector 14. Unlike this, in the case of Preferred Embodiment 2 of the present invention, a depressed portion of a resin package is provided along an entire or substantially an entire outer peripheral edge of a first surface of a detector. A semiconductor device according to Preferred Embodiment 2 is described with a focus on this different point.

Figure 7:
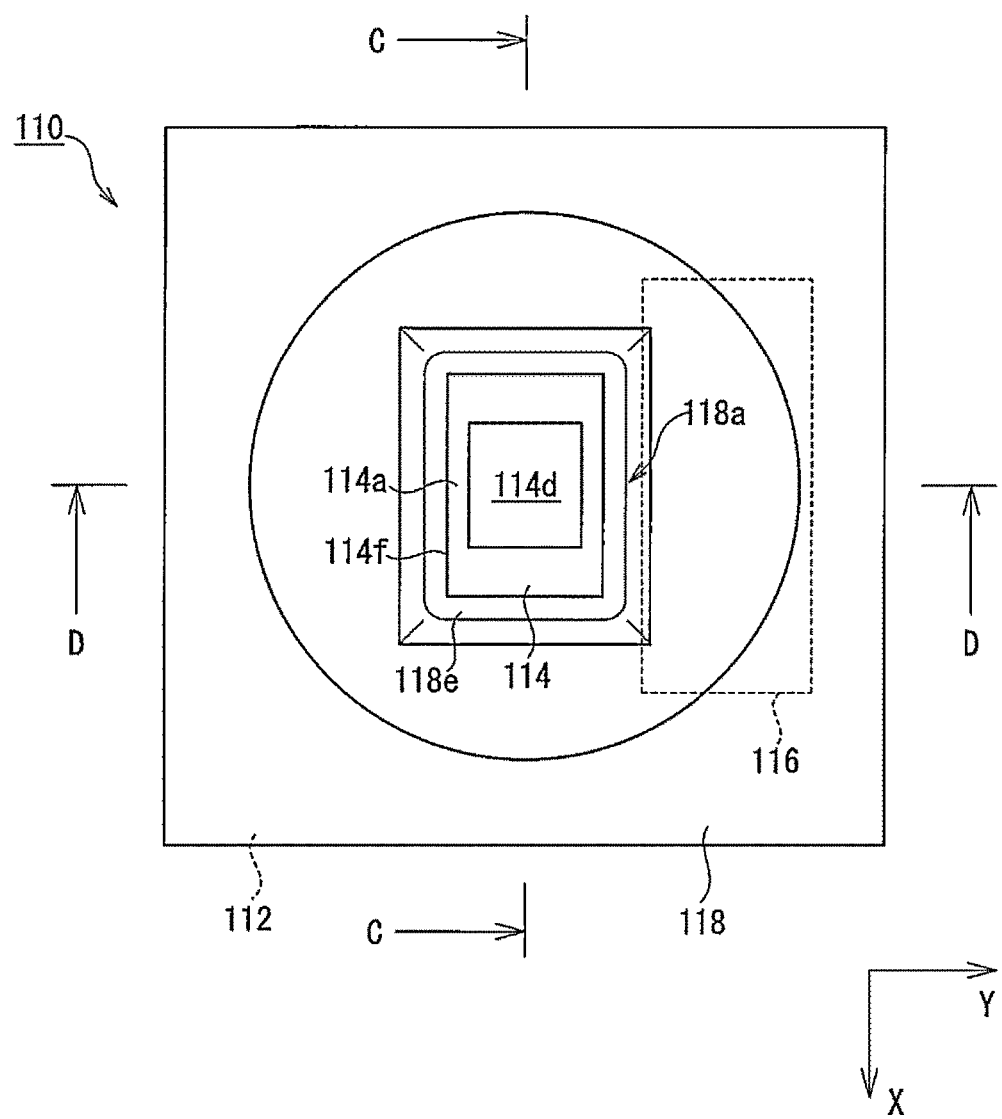
FIG. 7 is a top view of a semiconductor device according to Preferred Embodiment 2 of the present invention.

FIG. 7 is a top view of the semiconductor device according to Preferred Embodiment 2. Further, FIGS. 8A and 8B are sectional views of the semiconductor device according to Preferred Embodiment 2 taken along the lines C-C and D-D of FIG. 7.

Figure 8A:
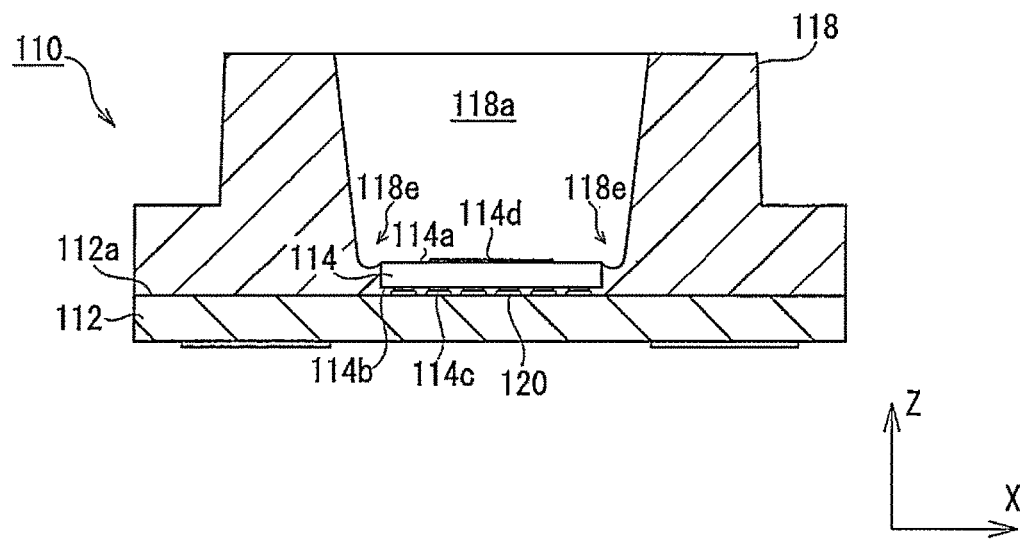
FIG. 8A is a sectional view of the semiconductor device taken along the line C-C of FIG. 7.
Figure 8B:
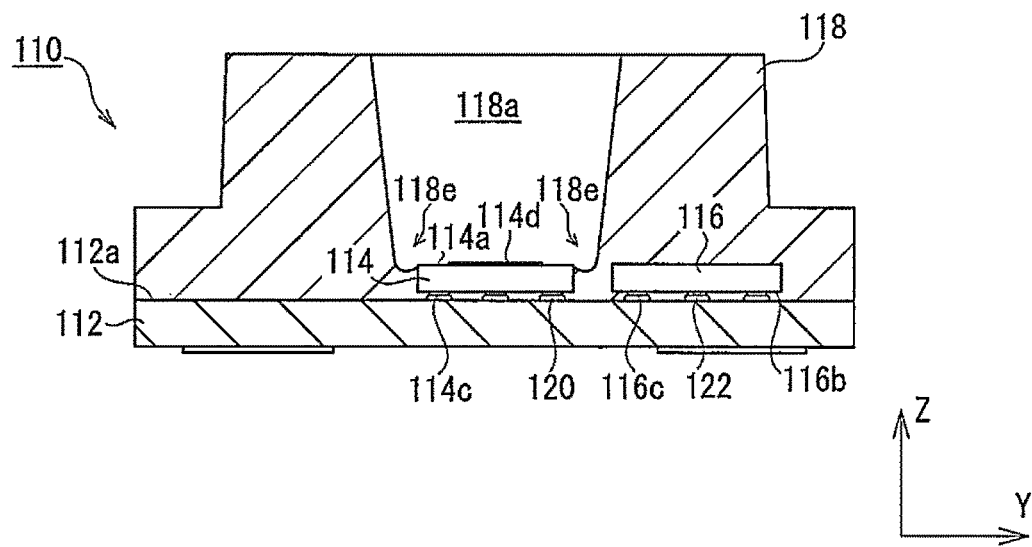
FIG. 8B is a sectional view of the semiconductor device taken along the line D-D of FIG. 7.

As illustrated in FIG. 7 and FIGS. 8A and 8B, in a semiconductor device 110 according to Preferred Embodiment 2, a detector 114 includes a plurality of connection terminals 114c provided on, not a first surface 114a on which a detection portion 114d is provided, but a second surface 114b on the side opposite to the first surface 114a.

The detector 114 is provided on a base 112 with the second surface 114b facing the base 112. Further, the plurality of connection terminals 114c on the second surface 114b are electrically connected to the base 112 (the conductor pattern on a first surface 112a thereof) with a solder 120 interposed therebetween.

With the detector 114, since no connection terminal is provided on the first surface 114a, there is no need to cover the first surface 114a of the detector 114 with a resin package 118. Thus, as illustrated in FIG. 7, the resin package 118 includes a depressed portion 118e, an outer peripheral edge 114f of the first surface 114a of the detector 114 is entirely or substantially entire exposed in an exposure hole 118a, and the annular depressed portion 118e is provided along the outer peripheral edge 114f exposed in the exposure hole 118a.

In the case of Preferred Embodiment 2, a circuit 116 includes a plurality of connection terminals 116c provided on a second surface 116b facing the base 112. Further, the plurality of connection terminals 116c are electrically connected to the base 112 with a solder 122 interposed therebetween.

According to Preferred Embodiment 2, as in Preferred Embodiment 1 described above, in the semiconductor device 110 including the detector 114 including the detection portion 114d and the resin package 118 including the exposure hole 118a to externally expose the detection portion 114d, a reduction in detection performance of the detector 114 due to the resin package 118 can be reduced or prevented.

Although the present invention has been described above with reference to preferred embodiments, the preferred embodiments of the present invention are not limited to those described above.

For example, in the case of Preferred Embodiment 1 described above, as illustrated in FIG. 2 and FIG. 3B, the detector 14 and the circuit 16 are mounted side by side on the base 12. However, the preferred embodiments of the present invention are not limited to this.

For example, the circuit may be mounted on the base and the detector may be mounted on the circuit. That is, the detector may be indirectly provided on the base with the circuit interposed therebetween. In this case, for example, the detector may be electrically connected to the circuit with a bonding wire or solder interposed therebetween.

Alternatively, the detector and the circuit may be integrated with each other. For example, the circuits in the circuit may be incorporated in the detector.

When a semiconductor device is mounted on the casing of an electronic device, the resin package of the semiconductor device may be deformed with a force from the casing of the electronic device and stress may be generated in a detector buried in the resin package. As a result, there is a risk that the characteristics of the detector may change.

Figure 9:
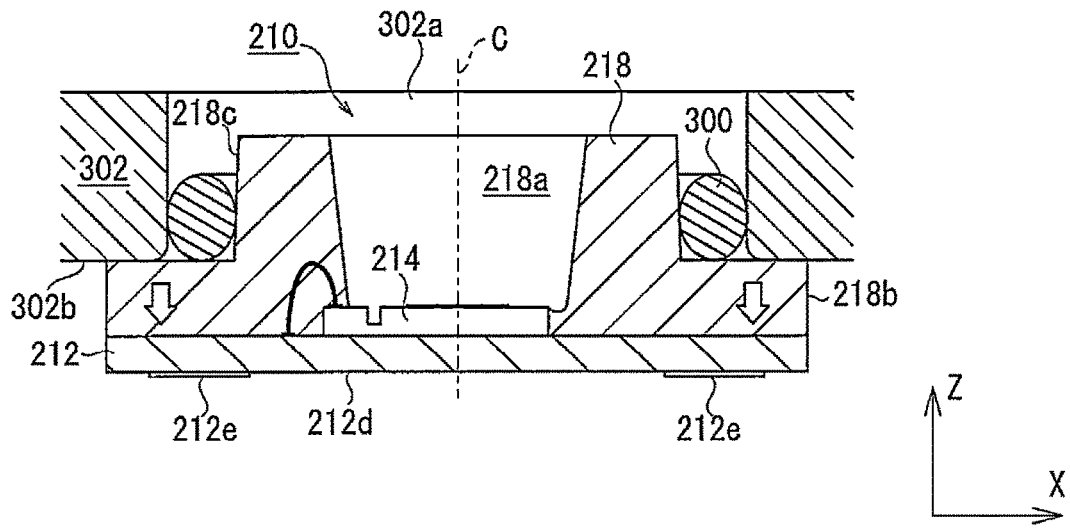
FIG. 9 is a sectional view of a semiconductor device according to another preferred embodiment of the present invention mounted on a casing of an electronic device.
Figure 10:
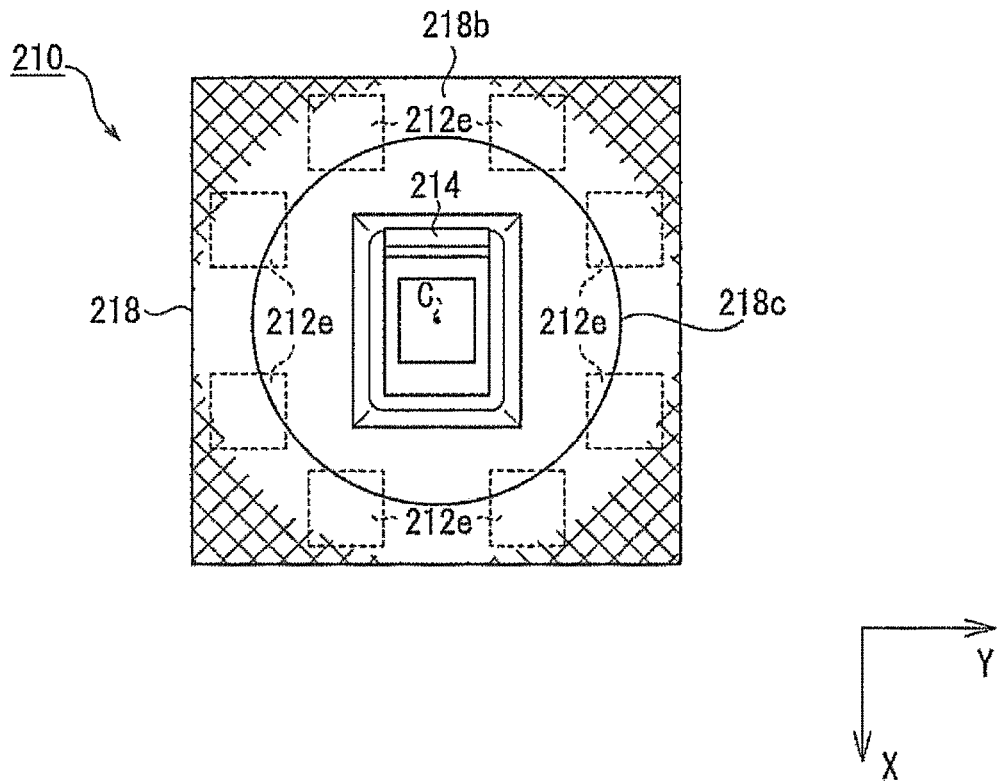
FIG. 10 is a top view of the semiconductor device according to the another preferred embodiment of the present invention.

FIG. 9 is a sectional view of a semiconductor device according to another preferred embodiment of the present invention mounted on the casing of an electronic device. FIG. 10 is a top view of the semiconductor device according to the another preferred embodiment of the present invention.

In a semiconductor device 210 according to another preferred embodiment of the present invention, a resin package 218 includes a main body portion 218b and a cylindrical ring holding portion 218c. As illustrated in FIG. 9, the semiconductor device 210 is mounted on a casing 302 of an electronic device with the ring holding portion 218c including an O-ring 300 fitted thereon inserted into a through hole 302a of the casing 302 of the electronic device. Further, an opening edge portion 302b of the through hole 302a is in contact with the main body portion 218b so that a shear force is applied to the portion of the main body portion 218b that is positioned in the outer side portion of the ring holding portion 218c. With this, the portion of the main body portion 218b that is positioned in the outer side portion of the ring holding portion 218c of the resin package 218 is deformed, with the result that a bending stress or a tensile stress may be generated in a detector 214 buried in the resin package 218. In FIG. 9, the shear force described above is indicated by the open arrow. In FIG. 10, the portion of the main body portion 218b that is in contact with the opening edge portion 302b of the through hole 302a in the main body portion 218b is indicated by cross hatching.

To prevent such stress generation in the detector 214, as illustrated in FIG. 10, in the top view of a base 212 (the view from the Z-axis direction that is a direction orthogonal or substantially orthogonal to the drawing sheet), a plurality of external connection terminals 212e are provided around a center line C of the cylindrical ring holding portion 218c on a second surface 212d of the base 212. In particular, in the top view of the base 212, the external connection terminals 212e are at least partially located in the outer side portion of the periphery of the ring holding portion 218c. With this, the plurality of external connection terminals 212e reduce or prevent the portion of the main body portion 218b that is located in the outer side portion of the ring holding portion 218c from being deformed, with the result that the generation of stress in the detector 214 buried in the resin package 218 is reduced or prevented.

Further, in the case of Preferred Embodiment 1 described above, the semiconductor device 10 is, for example, a pressure sensor configured to measure pressure. However, preferred embodiments of the present invention are not limited to this. For example, semiconductor devices according to preferred embodiments of the present invention may be, for example, a sensor to detect (measure) light, ultrasonic waves, specific gases, or the like or may be a microphone. That is, the semiconductor devices according to preferred embodiments of the present invention are semiconductor devices each including a detector in which a detection portion is exposed to the outside of the semiconductor device so that the detection portion can detect a detection target. For example, when the semiconductor device is an optical sensor to detect light, the semiconductor device includes a photodiode as the detector. Further, for example, when the semiconductor device is an ultrasonic sensor to detect ultrasonic waves, the semiconductor device includes, for example, an ultrasonic transducer as the detector.

Although the present invention has been described above with reference to preferred embodiments, it is apparent to those skilled in the art that a preferred embodiment can be fully or partially combined with at least another preferred embodiment to achieve still another preferred embodiment according to the present invention.

Preferred embodiments of the present invention are applicable to semiconductor devices each including a detector including a detection portion and a resin package to externally expose the detection portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
   a base;
   a detector on the base and including a first surface on which a detection portion is provided; and
   a resin package on the base and including an exposure hole to externally expose the detection portion of the detector; wherein
   at least a portion of an outer peripheral edge of the first surface of the detector is exposed in the exposure hole;
   the resin package includes a depressed portion along the portion of the outer peripheral edge that is exposed in the exposure hole;
   at least a portion of the detector is buried in the resin package; and
   the depressed portion is depressed with respect to the portion of the outer peripheral edge that is exposed in the exposure hole.

2. The semiconductor device according to claim 1, wherein
   the detector includes a connection terminal on the first surface and adjacent to a portion of the outer peripheral edge;
   a portion of the outer peripheral edge other than the portion adjacent to the connection terminal is exposed in the exposure hole; and
   the connection terminal is covered by the resin package.

3. The semiconductor device according to claim 2, wherein the detector includes a groove in a portion between the detection portion and the connection terminal on the first surface.

4. The semiconductor device according to claim 1, wherein
   the detector includes a connection terminal on a second surface on a side opposite to the first surface;
   the outer peripheral edge of the first surface of the detector is exposed in the exposure hole; and
   the depressed portion is an annular depressed portion along the outer peripheral edge exposed in the exposure hole.

5. The semiconductor device according to claim 1, further comprising a circuit provided on the base and buried in the resin package.

6. The semiconductor device according to claim 5, wherein the circuit is fixed to the base with an adhesive.

7. The semiconductor device according to claim 6, wherein the adhesive is a die attach film or a die bond material.

8. The semiconductor device according to claim 5, wherein the circuit includes an application specific integrated circuit.

9. The semiconductor device according to claim 5, wherein the circuit includes a signal processing circuit configured or programmed to process a signal output from the detector and output the processed signal to the base.

10. The semiconductor device according to claim 1, wherein the base includes a wiring substrate.

11. The semiconductor device according to claim 10, wherein the wiring substrate is a ceramic substrate or a resin substrate.

12. The semiconductor device according to claim 1, wherein the detector includes a pressure sensor.

13. The semiconductor device according to claim 1, wherein the detector includes a piezoresistive pressure sensor or an electrostatic capacitive pressure sensor.

14. A semiconductor device comprising:
    a base;
    a detector on the base and including a first surface on which a detection portion is provided; and
    a resin package on the base and including an exposure hole to externally expose the detection portion of the detector; wherein
    at least a portion of an outer peripheral edge of the first surface of the detector is exposed in the exposure hole;
    the resin package includes a depressed portion along the portion of the outer peripheral edge that is exposed in the exposure hole;
    the resin package includes a main body portion on the base and a cylindrical ring holding portion in a central portion of a surface of the main body portion on a side opposite to the base, the cylindrical ring holding portion including, at a top surface thereof, an opening of the exposure hole;
    the base further includes, on a surface of the base on a side opposite to the resin package, a plurality of external connection terminals around a center line of the ring holding portion; and in a top view of the base, each of the plurality of external connection terminals is at least partially located in an outer side portion of a periphery of the ring holding portion.

15. A method of manufacturing a semiconductor device in which, on a base on which a detector including a first surface on which a detection portion is located is provided, a resin package that includes an exposure hole to externally expose the detection portion of the detector is provided, the method comprising:
   bringing a mold release film into close contact with a mold that includes a cavity with a projection;
   placing the mold with respect to the base such that the first surface of the detector sinks into a portion of the mold release film that is located on a top surface of the projection;
   filling the cavity of the mold with a melted resin material;
   separating the mold and the mold release film from the resin package that includes a solidified resin material; and
   positioning an outer peripheral edge of the top surface of the projection so that, in a view from a direction in which the projection of the mold and the first surface of the detector face each other, the outer peripheral edge is at least partially positioned in an outer side portion of an outer peripheral edge of the first surface.

16. The method of manufacturing a semiconductor device according to claim 15, wherein
   the detector includes a connection terminal on the first surface so as to be adjacent to a portion of the outer peripheral edge; and
   in the view from the direction in which the projection of the mold and the first surface of the detector face each other, the outer peripheral edge of the top surface of the projection is partially located in an outer side portion of a portion of the outer peripheral edge of the first surface other than the portion adjacent to the connection terminal.

17. The method of manufacturing a semiconductor device according to claim 16, wherein the detector includes a groove in a portion between the detection portion and the connection terminal on the first surface.

18. The method of manufacturing a semiconductor device according to claim 15, wherein
   the detector includes a connection terminal on a second surface on a side opposite to the first surface; and
   in the view from the direction in which the projection of the mold and the first surface of the detector face each other, the outer peripheral edge of the top surface of the projection is entirely or substantially entirely located in the outer side portion of the outer peripheral edge of the first surface.

* * * * *